US 9,527,595 B2

United States Patent
Inkpen et al.

(10) Patent No.: US 9,527,595 B2
(45) Date of Patent: Dec. 27, 2016

(54) APPARATUS AND METHOD OF MONITORING FOR MATTER ACCUMULATION ON AN AIRCRAFT SURFACE

(71) Applicant: Instrumar Limited, St. John's (CA)

(72) Inventors: Stuart Inkpen, St. Philips (CA); Chris Nolan, St. John's (CA); Bill Conway, St. John's (CA); Dana Linfield, Portugal Cove-St. Philips (CA); David Bonnell, St. John's (CA); Joshua Swamidas, St. John's (CA); Ruth Abraham, St. John's (CA)

(73) Assignee: Instrumar Limited, Newfoundland (CA)

( * ) Notice: Subject to any disclaimer, the term of this patent is extended or adjusted under 35 U.S.C. 154(b) by 92 days.

(21) Appl. No.: 14/370,421

(22) PCT Filed: Jan. 7, 2013

(86) PCT No.: PCT/CA2013/000003
§ 371 (c)(1),
(2) Date: Jul. 2, 2014

(87) PCT Pub. No.: WO2013/102266
PCT Pub. Date: Jul. 11, 2013

(65) Prior Publication Data
US 2015/0042316 A1 Feb. 12, 2015

Related U.S. Application Data

(60) Provisional application No. 61/583,838, filed on Jan. 6, 2012.

(51) Int. Cl.
*G01R 19/00* (2006.01)
*B64D 15/20* (2006.01)
(Continued)

(52) U.S. Cl.
CPC .............. *B64D 15/20* (2013.01); *B64D 15/22* (2013.01); *G01B 7/06* (2013.01); *G01B 21/085* (2013.01);
(Continued)

(58) Field of Classification Search
CPC ......... B64D 15/20; B64D 15/22; G01K 13/00; G01R 19/0092; G08B 19/02; G01B 7/06
See application file for complete search history.

(56) References Cited

U.S. PATENT DOCUMENTS

| 4,766,369 A | * | 8/1988 | Weinstein | G01W 1/00 244/134 F |
| 5,191,791 A | | 3/1993 | Gerardi et al. | |
| | | | (Continued) | |

FOREIGN PATENT DOCUMENTS

WO 03/002410 1/2003

OTHER PUBLICATIONS

International Search Report re PCT/CA2013/000003, dated Apr. 22, 2013, 3 pgs.
(Continued)

*Primary Examiner* — Vinh Nguyen
(74) *Attorney, Agent, or Firm* — Greenberg Traurig, LLP

(57) ABSTRACT

A method of monitoring the accumulation of matter on an external surface of an aircraft involves applying varying electric fields to the aircraft surface, and a sensor monitor receiving a time-series of measurements of a temperature of the aircraft surface and a phase and a magnitude of a current induced in an electric field sensor unit from the varying electric fields. The electric field sensor unit is mounted proximate the aircraft surface. The time-series of the measurements varies in accordance with the instantaneous accumulation of matter on the aircraft surface. The sensor monitor generates an assessment of the accumulation of matter on the aircraft surface from a correlation of the time-series of the measurements with at least one predetermined matter accumulation profile. Each predetermined matter accumulation profile comprises a corresponding time-series of current phase, current magnitude and temperature measurements.

16 Claims, 4 Drawing Sheets

(51) Int. Cl.
  *B64D 15/22* (2006.01)
  *G01B 7/06* (2006.01)
  *G08B 19/02* (2006.01)
  *G01B 21/08* (2006.01)
  *G01K 13/00* (2006.01)
(52) U.S. Cl.
  CPC ........... G01K 13/00 (2013.01); G01R 19/0092 (2013.01); G08B 19/02 (2013.01)

(56) References Cited

U.S. PATENT DOCUMENTS

| | | | |
|---|---|---|---|
| 5,313,202 A | 5/1994 | Hansman, Jr. et al. | |
| 5,394,340 A * | 2/1995 | Inkpen | B64D 15/20 244/134 F |
| 5,398,547 A | 3/1995 | Gerard | |
| 5,474,261 A * | 12/1995 | Stolarczyk | B64D 15/20 244/134 F |
| 5,484,121 A | 1/1996 | Padawer | |
| 5,551,288 A | 9/1996 | Gerarldi | |
| 5,874,672 A | 2/1999 | Gerarldi | |
| 7,370,525 B1 | 5/2008 | Zhao et al. | |
| 7,466,146 B2 | 12/2008 | Stewart et al. | |
| 7,586,419 B2 | 9/2009 | Ikiades et al. | |
| 8,907,798 B2 * | 12/2014 | Meis | B64D 15/00 219/202 |
| 9,180,972 B2 | 11/2015 | Meis et al. | |
| 2006/0064196 A1 * | 3/2006 | Inkpen | G05B 23/0235 700/142 |
| 2008/0257033 A1 | 10/2008 | Roberts | |

OTHER PUBLICATIONS

On-Wings, Aerodays Workshop, On Wing Ice Detection and Monitoring System, Apr. 1, 2011, 25 pages, Madrid.

FAA, Federal Register vol. 75, No. 124, Jun. 29, 2010, 29 pages.

* cited by examiner

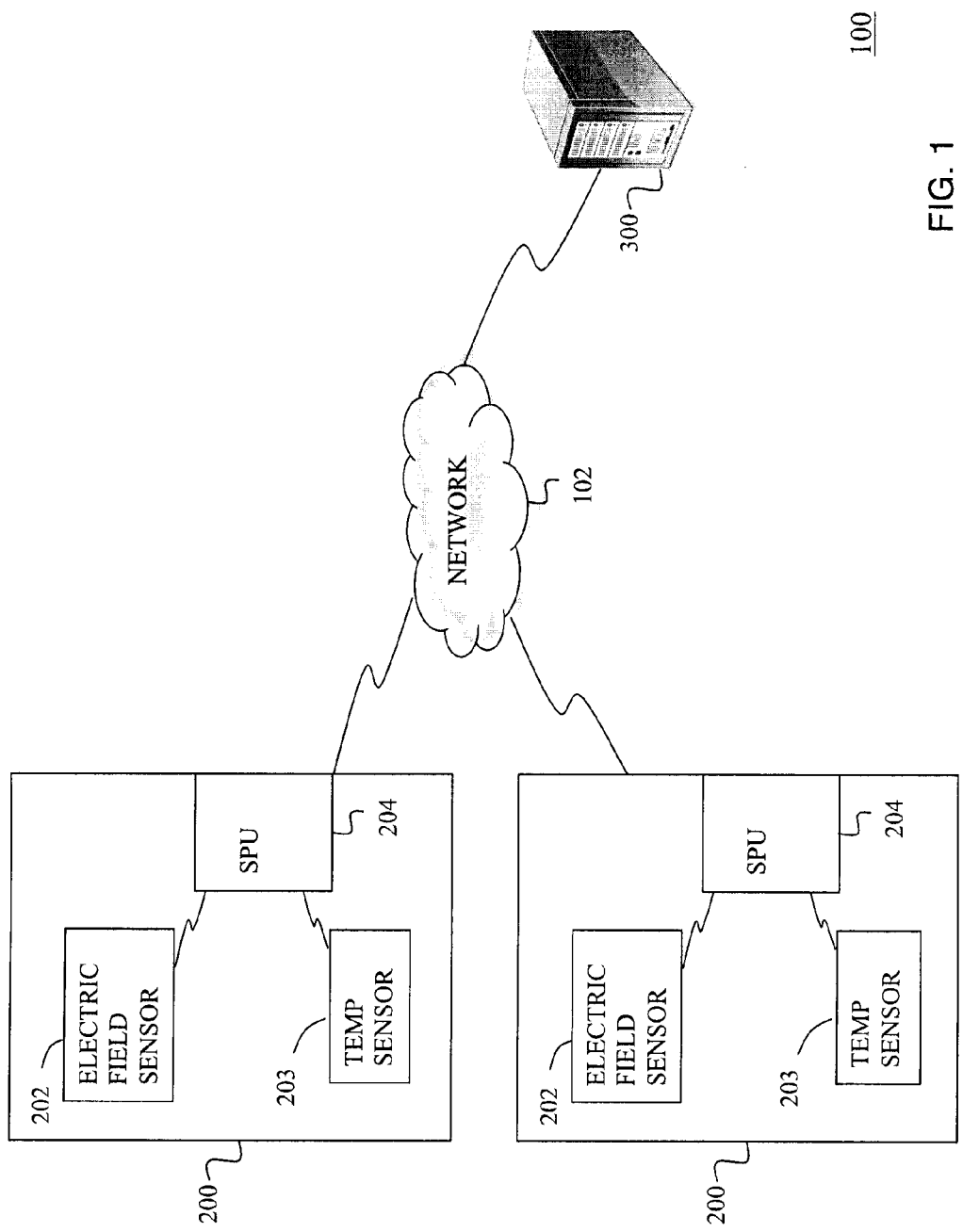

APPARATUS AND METHOD OF MONITORING FOR MATTER ACCUMULATION ON AN AIRCRAFT SURFACE

RELATED APPLICATIONS

This patent application claims the benefit of the filing date of U.S. patent application Ser. No. 61/583,838, entitled "Apparatus and Method of Monitoring In-Flight Super-Cooled Large Water Droplet Accumulation", filed Jan. 6, 2012.

FIELD

This patent application relates to a mechanism for monitoring the accumulation of matter on an exterior surface of an aircraft. In particular, this patent application describes a method and system for monitoring the accumulation of ice and water on an aircraft exterior surface.

BACKGROUND

Freezing rain or freezing drizzle can create an ice irregularity on the upper surface of an airplane wing while the airplane is in flight. The ice irregularity can lead to loss of control of the airplane, particularly if the irregularity forms aft of the leading edge protection devices (e.g. de-icing boots) and forward of the control surfaces (e.g. ailerons). Ice accumulation on critical airplane surfaces, arising from exposure to super-cooled large water droplets during flight, is suspected of causing power loss and engine damage in some instances. Accordingly, aircraft regulatory authorities are recommending that manufacturers be required to demonstrate that their airplanes are capable of operating safely in freezing rain/drizzle and mixed water/ice crystal atmospheric conditions, including warning flight-crews of super-cooled large water droplet accumulation on critical aircraft surfaces.

SUMMARY

In one aspect, this patent application describes a method of monitoring the accumulation of matter on an external surface of an aircraft. The method involves applying varying electric fields to the aircraft surface, and a sensor monitor receiving a time-series of measurements of a temperature of the aircraft surface and a phase and a magnitude of a current induced in an electric field sensor unit from the varying electric fields. The electric field sensor unit is mounted proximate the aircraft surface.

The time-series of the measurements varies in accordance with the instantaneous accumulation of matter on the aircraft surface. The sensor monitor generates an assessment of the accumulation of matter on the aircraft surface from a correlation of the time-series of the measurements with at least one predetermined matter accumulation profile. Each predetermined matter accumulation profile comprises a corresponding time-series of current phase, current magnitude and temperature measurements.

In another aspect, this patent application describes a matter accumulation monitoring system that includes an electric field sensor unit and a sensor monitor. The electric field sensor unit is configured to apply varying electric fields to an aircraft surface. The sensor monitor is in communication with the electric field sensor unit, and is configured to receive a time-series of measurements of a temperature of the aircraft surface and a phase and a magnitude of a current induced in the electric field sensor unit from the varying electric fields. The time-series of the measurements varies in accordance with the instantaneous accumulation of matter on the aircraft surface.

The sensor monitor is further configured to generate an assessment of the accumulation of matter on the aircraft surface from a correlation of the time-series of the measurements with at least one predetermined matter accumulation profile. Each predetermined matter accumulation profile comprises a corresponding time-series of current phase, current magnitude and temperature measurements.

The sensor monitor may also be configured to activate an alarm in accordance with a result of the correlation. The electric field sensor unit may comprise an electric field sensor, and a sensor processing unit coupled to the electric field sensor, and the sensor processing unit may be configured to generate the phase and magnitude measurements by periodically monitoring the amplitude of a current signal induced in the electric field sensor.

In one implementation, the electric field sensor comprises an insulating substrate, a plurality of non-contacting electrodes disposed on the substrate, and a plurality of conductors that are coupled to the electrodes and extend transversely through the substrate. The non-contacting electrodes may comprise a first electrode portion and a second electrode portion interlaced with the first electrode portion, and the conductors may comprise a first conductor portion and a second conductor portion, the first portion of the conductors being coupled to the first electrode portion, the second portion of the conductors being coupled to the second electrode portion. Preferably, the electrodes are disposed parallel to each other on the substrate, and the conductors comprise vias that extend at a right angle to the electrodes.

The measurements of the predetermined matter accumulation profiles may be associated with the accumulation of ice, and the sensor monitor may be configured to generate an assessment in substantially real-time of the accumulation of ice on the aircraft surface. The measurements of the predetermined matter accumulation profiles may be associated with the accumulation of super-cooled large water droplets as the aircraft is in-flight, and the sensor monitor may be configured to generate an assessment in substantially real-time of the accumulation of super-cooled large water droplets on the aircraft surface as the aircraft is in flight.

BRIEF DESCRIPTION OF THE DRAWINGS

The foregoing aspects will now be described, by way of example only, with reference to the accompanying drawings, in which:

FIG. 1 is a schematic view of the matter accumulation monitoring system, depicting the electric field sensor unit and the sensor monitor;

FIG. 2a is a top plan view of the electric field sensor depicted in FIG. 2a;

DETAILED DESCRIPTION

1. Matter Accumulation Monitoring System: Overview

Figure 2B:
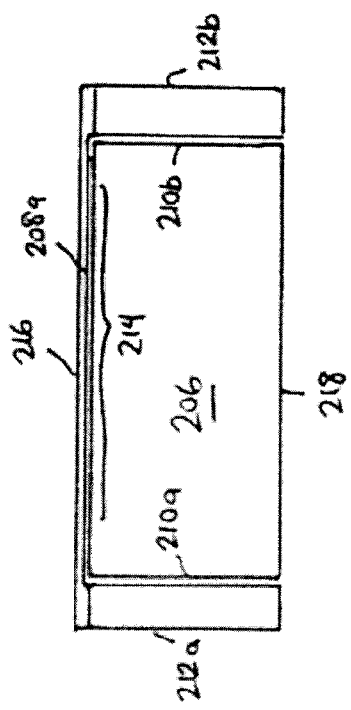
FIGS. 2b and 2c are transverse cross-sectional views of the electric field sensor.

Turning now to FIG. 1, there is shown a matter accumulation monitoring system, denoted generally as 100, comprising one or more electric field sensor units 200, a sensor monitor 300, and a local area network 102 interconnecting the electric field sensor units 200 and the sensor monitor 300.

2. Electric Field Sensor Unit

Each electric field sensor unit 200 is disposed proximate an exterior surface of an aircraft, at a respective region thereof, to monitor the accumulation of matter on the respective region of the aircraft surface. Preferably, the matter to be monitored is ice, and one or more of the electric field sensor units 200 are mounted on the exterior surface of an aircraft at regions thereof that are prone to the accumulation of ice. Alternately, the matter to be monitored is super-cooled large water droplets (SLDs) and one or more of the electric field sensor units 200 are positioned in regions of the aircraft that are prone to the SLD accumulation while the aircraft is in flight.

Typically an aircraft is fitted with a plurality of the electric field sensor units 200. The placement of the electric field sensor units 200 at the appropriate locations on the aircraft for the detection and monitoring of the desired matter in-flight is within the skill set of the person skilled in the art. For example, the LEWICE ice accretion simulation tool (http://spinoff.nasa.gov/Spinoff2011/ps_2.html) can be used to model the ice accretion profile necessary to optimize the placement of sensors on any wing surface for the detection of a broad range of in-flight icing conditions, including the accumulation of super-cooled large water droplets. Through experimentation, it is also expected that the person of ordinary skill could determine the appropriate placement of the electric field sensor units 200 to detect ice accumulation while the aircraft is on the ground.

As shown in FIG. 1, preferably each electric field sensor unit 200 includes an electric field sensor 202, a temperature sensor 203, and a sensor processing unit (SPU) 204 coupled to the electric field sensor 202 and the temperature sensor 203. Alternately, the electric field sensor unit 200 may comprise a plurality of electric field sensors 202, a plurality of temperature sensors 203, and a SPU 204 coupled to the electric field sensors 202 and the temperature sensors 203.

Each electric field sensor 202 generates a varying local electric field at the exterior surface of the aircraft, and a current is induced in the electric field sensor 202 by the associated varying local electric field. The magnitude and phase of the induced current varies with the characteristics of the material that is within the electric field established by the electric field sensor 202. The temperature sensor 203 monitors the temperature on the respective region of the aircraft surface. Accordingly, the electric field sensor(s) 202 and temperature sensor(s) 203 together provide periodic data samples indicative of the accumulation of matter on the aircraft surface. As mentioned, while the electric field sensor units 200 may be positioned to detect the accumulation of matter while the aircraft is in flight, it is also expected that the electric field sensor unit 200s may be positioned to detect the accumulation of matter (in particular accumulation of ice) while the aircraft is on the ground. Accordingly, the local electric fields may be generated, and the induced current detected, while the aircraft is in-flight or on the ground.

Figure 2C:
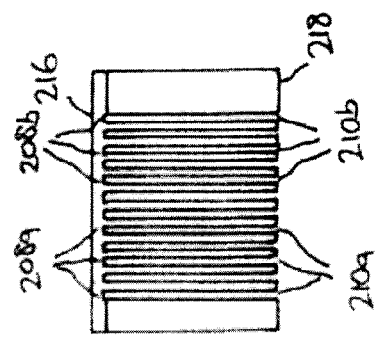
Figure 2A:
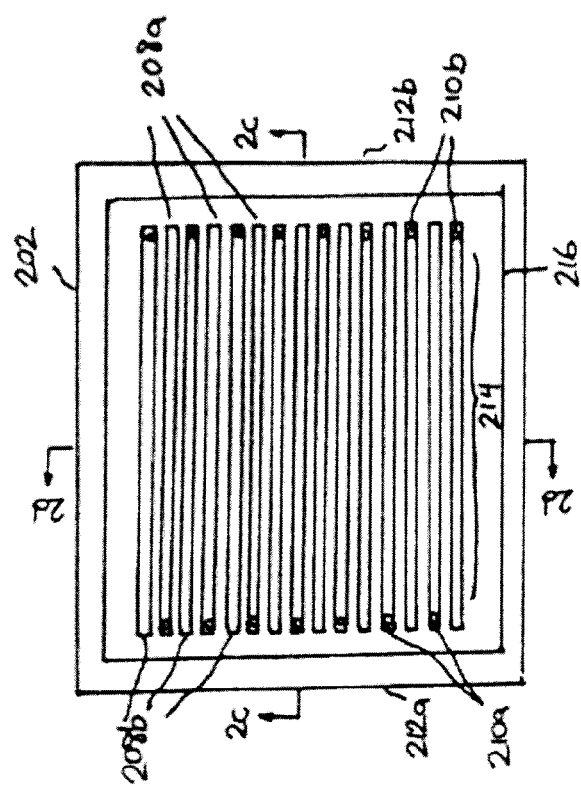

As shown in FIGS. 2a, 2b and 2c, each electric field sensor 202 comprises an insulating substrate 206, a plurality of electrodes 208 disposed on the substrate 206, and a plurality of vias 210 extending downwardly through the substrate 206. Preferably, the substrate 206 comprises a non-conductive material, such as ceramic, although other non-conductive materials may be used. Also, preferably the electrodes 208 are substantially planar and are formed on the substrate 206 using conventional printed circuit board or integrated circuit manufacturing techniques. The electrodes 208 extend across the top surface of the substrate 206 in a substantially parallel fashion, such that the electrodes 208 do not contact one another on the top surface of the substrate 206.

The electrodes 208 are segregated into a first electrode portion 208a, and a second electrode portion 208b. The electrodes 208 of the first electrode portion 208a extend from one end 212a of the substrate 206, and the electrodes 208 of the second electrode portion 208b extend from the opposite end 212b of the substrate 206. The electrodes 208 of the first electrode portion 208a are interlaced with the electrodes 208 of the second electrode portion 208b in the centre region 214 of the top surface of the substrate 206.

Typically, each via 210 comprises a plated through-hole extending from one end of a respective electrode 208, through the substrate 206, to the bottom 218 of the sensor 202. Alternately, the vias 210 may be provided as conductive traces or wires extending in a similar manner. The vias 210 are segregated into a first via portion 210a, and a second via portion 210b. The vias 210 of the first via portion 210a are coupled to the first electrode portion 208a, and the vias 210 of the second via portion 210b are coupled to the second electrode portion 208b. Each via 210 is connected to a respective electrode 208 adjacent the respective end 212, and extends at a right angle from the electrode 208 through the substrate 206, from the top surface thereof to the bottom surface 218 thereof. With this configuration, the sensitivity of the electric field sensor 202 to electric fields outside the centre region 214 is less than conventional electric field sensors.

The electric field sensor 202 preferably also includes an insulator layer 216 disposed over the electrodes 208. Typically, the insulator layer 216 comprises ceramic or glass, although the ceramic alumina is preferred due to its hardness.

Preferably, each temperature sensor 203 is incorporated into the substrate 206 of the associated electric field sensor 202, and includes a via 210 that extends through the substrate 206 to the bottom surface 218. Alternately, the temperature sensor 203 may be disposed in a substrate that is separate from the substrate 206 of the associated electric field sensor 202, and may include a via 210 that extends through the substrate thereof to the bottom surface thereof.

The sensor processing unit (SPU) 204 includes a data bus that is connected to the vias 210 of the associated electric field sensor 202 and temperature sensor 203. Alternately, where the electric field sensor unit 200 comprises a plurality of the electric field sensors 202, the SPU 204 may include a plurality of data buses, each connected to the vias 210 of a respective one of the electric field sensors 202/temperature sensors 203.

Each via 210 connects to a respective conductor of the data bus at the bottom 216 of the sensor 202. Preferably, the SPU 204 includes an analog signal generator that applies sinusoidal voltage signals to the respective electrode portions 208 of the associated electric field sensor(s) 202, with the voltage signal applied to the first electrode portion 208a preferably being complementary (i.e. 180 degrees out of phase) to the voltage signal applied to the second electrode portion 208b.

The SPU 204 includes an internal A/D converter that periodically digitizes, over a measurement time span, current samples received from the associated electric field sensor(s) 202 and temperature samples received from the associated temperature sensor(s) 203. The SPU 204 also includes a signal processor that uses the digitized current measurement samples and the digitized temperature measurement samples to create a series of data packets, which the SPU 204 preferably outputs in substantially real time to the sensor monitor 300.

Preferably, each data packet includes a series of measurement data sets. Each measurement data set includes a magnitude measurement and a phase measurement. Preferably, the SPU 204 derives the magnitude and phase measurements from the digitized current measurement samples by referencing the magnitude and phase of the current induced in the associated electric field sensor(s) 202 respectively to the magnitude and phase of the applied sensor voltage. In effect, then, the magnitude measurements are admittance measurements. However, for ease of reference, the magnitude (admittance) measurements will be referred to hereinafter as current magnitude measurements; and the phase measurements will be referred to hereinafter as current phase measurements.

In addition to the magnitude and phase measurements, preferably each measurement data set includes a digitized temperature measurement that was sampled at the same time as the associated digitized current measurement sample. Each data packet may also identify the time interval over which the current magnitude, current phase and temperature measurements included in the data packet were taken.

As mentioned, the A/D converter provides the signal processor with periodic samples of the current induced in the associated electric field sensor(s) 202 and the temperature measured by the associated temperature sensor(s) 203. The inventors have determined that the values for the magnitude, phase, and temperature measurements, and also the variability (e.g. rate of change, range of fluctuation) in those values between successive measurements, varies with the characteristics of the matter accumulating on the exterior surface of the aircraft. For example, the inventors have determined that the measured values vary much more significantly between successive measurement data sets with the accumulation of in-flight water than with the accumulation of in-flight ice. Therefore, to facilitate the differentiation between different matter accumulating on the exterior surface of the aircraft, the SPU 204 provides the sensor monitor 300 with a time-series of the current magnitude, current phase, and temperature measurements. As will be discussed, the sensor monitor 300 uses the time-series of magnitude, phase, and temperature measurements included in the data packets to generate a substantially real-time assessment of the accumulating matter.

3. Sensor Monitor

Figure 3:
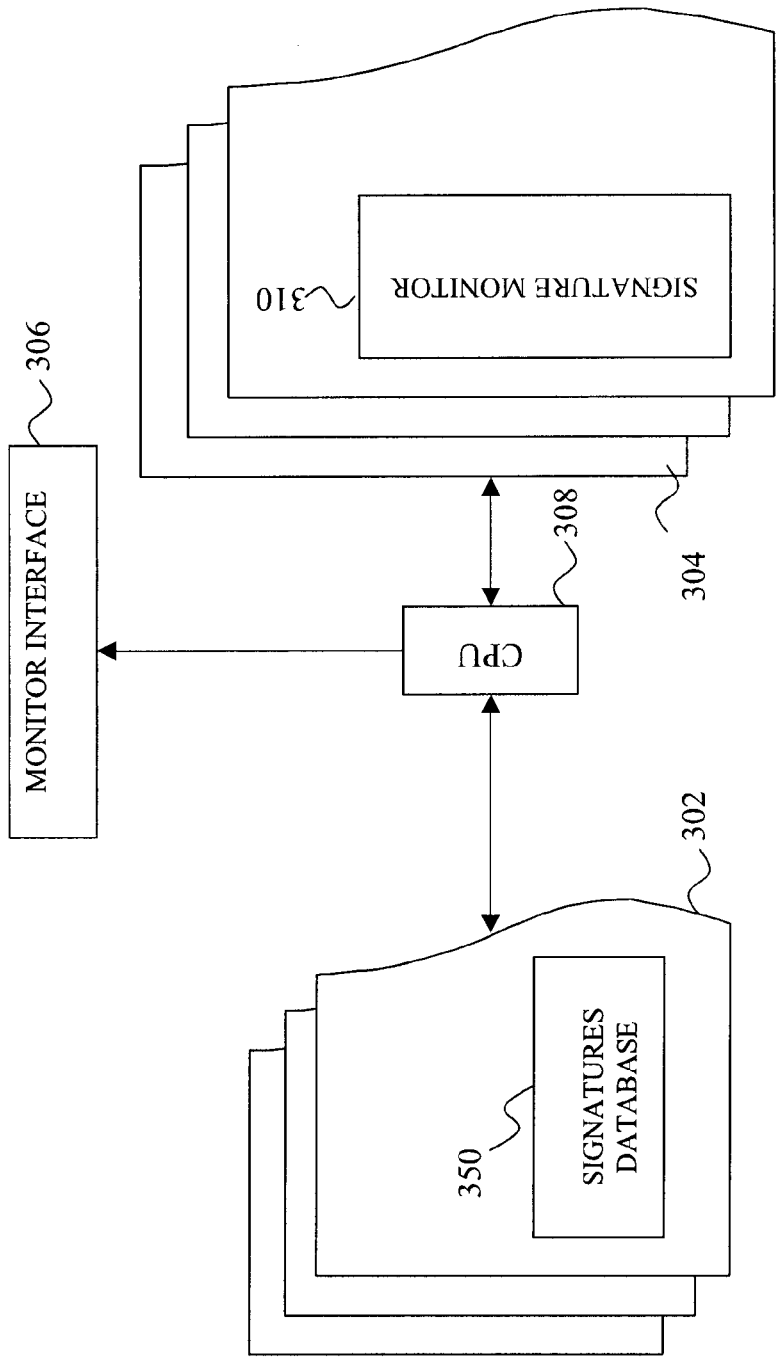
FIG. 3 is a schematic view of the structure of the sensor monitor.

The sensor monitor 300 is coupled to the SPUs 204 via the local area network 102. As shown in FIG. 3, the sensor monitor 300 may be configured as a computing device, comprising a non-volatile memory (ROM) 302, a volatile memory (RAM) 304, a monitor interface 306, and a central processing unit (CPU) 308 that is coupled to the ROM 302, the RAM 304, and the monitor interface 306. The monitor interface 306 may interface the sensor monitor 300 with the instrumentation of the aircraft cockpit to thereby provide pilots with a substantially-real time assessment of the accumulation of matter on the exterior surface of the aircraft.

The ROM 302 may be provided as an electronic memory, a magnetic disc and/or an optical disc, and includes a signatures database 350 of one or more predetermined matter accumulation profiles. Each predetermined matter accumulation profile is associated with a particular characteristic (e.g. thickness, matter type) of the matter accumulated, and comprises a corresponding time-series of current phase, current magnitude and temperature measurements. Since the electric fields may be applied to the aircraft surface while the aircraft is in-flight or on the ground, typically each predetermined matter accumulation profile is representative of the current phase, current magnitude and temperature measurements for a particular matter characteristic while the aircraft is in-flight, or the current phase, current magnitude and temperature measurements for a particular matter characteristic while the aircraft is on the ground. The time-series of current phase, current magnitude and temperature measurements in each matter accumulation profile may be predetermined experimentally and/or via computer modelling, and is stored in the ROM 302 prior to installation of the sensor monitor 300 in the aircraft.

The ROM 302 also includes processing instructions for the sensor monitor 300 which, when loaded into the RAM 304 and executed by the CPU 308, define a signature monitor 310 that is configured to periodically send out read commands to the SPUs 204 requesting data packets from the SPUs 204. As discussed above, each data packet includes a time-series of measurement data sets each comprising the phase of the current induced in the electric field sensor unit 200, the magnitude of the induced current, and the temperature of the exterior surface of the aircraft. The signature monitor 310 is also configured to generate an assessment of the instantaneous accumulation of matter on the exterior surface of the aircraft in substantially-real time from a correlation between the received time series of measurement data sets and the predetermined matter accumulation profiles.

As discussed above, the signature monitor 310 may be implemented as a set of computer processing instructions. However, the implementation of the signature monitor 310 is not so limited, but may be implemented instead in electronics hardware, such as via a programmable logic controller, for example.

4. SLD Monitoring System: Method of Operation

Figure 4:
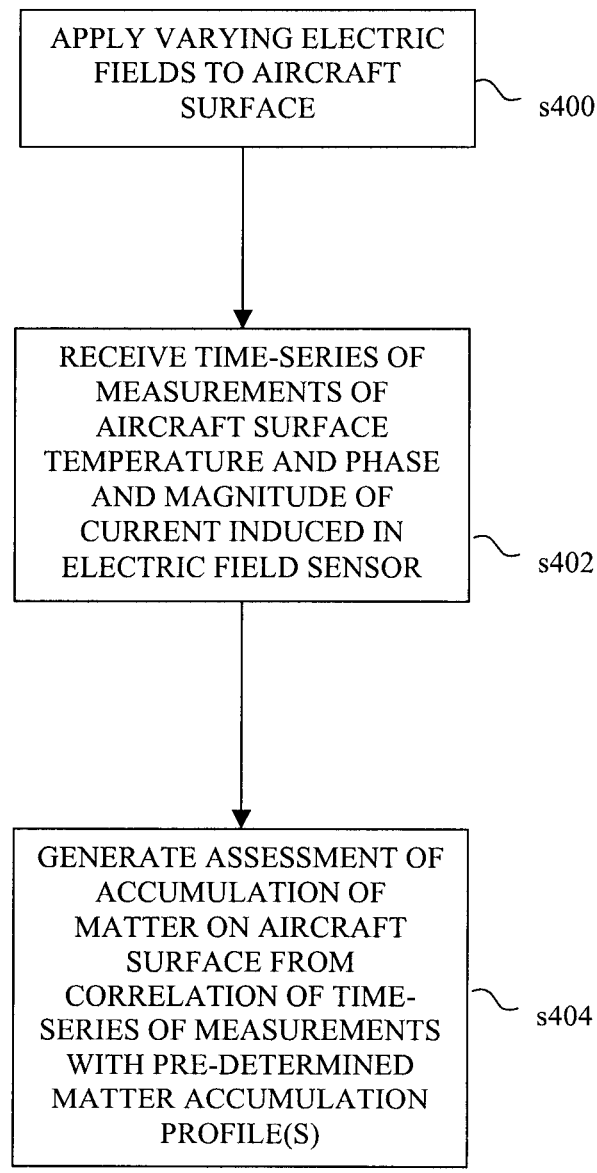
FIG. 4 is a flow-chart depicting the method of operation of the matter accumulation monitoring system.

The method of operation of the matter accumulation monitoring system 100 will now be described with reference to FIG. 4.

At step S400, the matter accumulation monitoring system 100 applies applying varying electric fields to the aircraft surface. To do so, the SPU 204 may apply sinusoidal voltage signals to the electrode portions 208 of the associated electric field sensor(s) 202, with the voltage signal applied to the first electrode portion 208a being 180 degrees out of phase with the voltage signal applied to the second electrode portion 208b. Alternately, instead of generating the alternating electric fields via the electric field sensor(s) 202, the monitoring system 100 may include dedicated electric field generators that are mounted to the aircraft surface and apply the alternating electric fields to the aircraft surface.

At step S402, the sensor monitor 300 receives a time-series of measurement data sets, each measurement data set comprising the phase and magnitude of the current induced in the electric field sensor unit 200, and the temperature of the exterior surface of the aircraft. To do so, the SPU 204 may periodically sample the current induced in the associated electric field sensor(s) 202, periodically sample the temperature measured by the associated temperature sensor(s) 203, and assemble the time-series of measurement data sets from the received data samples. The signature monitor 310 may periodically send out read commands to the SPUs 204 requesting the measurement data sets from the sensor processing units 204. Alternately, the SPUs 204 may periodically transmit the measurement data sets to the signature monitor 310, without waiting for a read command from the signature monitor 310. As noted above, the values in the measurement data sets, and the variability in those values between successive measurement data sets, will vary in accordance with the characteristics of the matter accumulating on the exterior surface of the aircraft.

At step S404, the sensor monitor 300 generates an assessment of the matter (e.g. thickness, matter type) accumulating on the aircraft surface. To do so, the signature monitor 310 may query the signatures database 350 with the time-series of measurements from one or more of the received measurement data sets, and generate the assessment from a correlation between the time-series of measurements and the predetermined matter accumulation profiles stored in the signatures database 350. As discussed above, each predetermined matter accumulation profile is associated with a particular characteristic (e.g. thickness, matter type) of accumulated matter. Where the time-series of received measurements correlates well with a particular matter accumulation profile, the sensor monitor 300 may generate the assessment from the characteristics of the located matter accumulation profile.

However, typically an aircraft will be fitted with a plurality of electric field sensor units 200, each located at a respective region of the exterior surface of the aircraft. Accordingly, the sensor monitor 300 may generate the assessment by querying the signatures database 350 with the measurement data sets received from a plurality of the electric field sensor units 200, and generate the assessment from a correlation between the received measurement data sets and a plurality of the predetermined matter accumulation profiles. In this variation, the assessment may include characteristics from the various matter accumulation profiles.

The sensor monitor 300 may thereafter transmit the results of the assessment to the aircraft cockpit for display on cockpit instrumentation. Alternately, or additionally, the sensor monitor 300 may initiate an automated control action (e.g. activate an alarm, invoke a reduction in the aircraft speed) in accordance with a result of the correlation, for example if the determined matter accumulation exceeds a predetermined process limit.

The inventors have obtained unexpectedly good results from the matter accumulation monitoring system 100. In a series of experiments conducted in an icing tunnel, electric field sensor units 200 were mounted on the external surface of an aircraft wing, and the aircraft wing was exposed to a range of test conditions, covering droplet sizes from 15 to 500 microns median volumetric diameter, liquid water content of approximately 0.35 g/m3, static temperatures from 0 to −25 C, and an airspeed of approximately 170 knots. Within these conditions, the matter accumulation monitoring system 100 had median early detection times of 10 to 15 seconds for ice accumulation. Moreover, the matter accumulation monitoring system 100 was able to differentiate between freezing precipitation and liquid precipitation. Given that conventional detection systems capable of distinguishing between a limited set of icing conditions (not including SLD) have a detection time of between 2 to 4 minutes, and the industry goal for detection times for new sensing technology is 1 minute, these test results demonstrated detection times that were unexpectedly good and could not have been predicted from the available literature.

We claim:

1. A method of monitoring the accumulation of matter on an external surface of an aircraft, comprising the steps of:
   applying varying electric fields to the aircraft surface;
   receiving, by a sensor monitor, a time-series of measurements of a temperature of the aircraft surface and a phase and a magnitude of a current induced in an electric field sensor of an electric field sensor unit from the varying electric fields, the electric field sensor unit being mounted proximate the aircraft surface, the time-series of the measurements varying in accordance with an instantaneous accumulation of matter on the aircraft surface; and
   generating, by said sensor monitor, an assessment of an accumulation of the matter on the aircraft surface from a correlation of the time-series of the measurements with at least one predetermined matter accumulation profile, each said predetermined matter accumulation profile comprising a corresponding time-series of current phase, current magnitude and temperature measurements,
   wherein the electric field sensor comprises:
   an insulating substrate;
   a plurality of electrodes disposed on the substrate and extending parallel to each other on the substrate, the electrodes comprising a plurality of first electrodes and a plurality of second electrodes interleaved and non-contacting with the plurality of first electrodes; and
   a plurality of vias coupled to the electrodes and extending transversely through the substrate.

2. The method according to claim 1, further comprising the sensor monitor activating an alarm in accordance with a result of the correlation.

3. The method according to claim 1, wherein the electric field sensor unit comprises a sensor processing unit coupled to the electric field sensor, and the sensor processing unit generates the at least one measurement set by periodically monitoring an amplitude of a current signal induced in the electric field sensor.

4. The method according to claim 1, wherein the vias comprise a first via portion and a second via portion, the first via portion being coupled to the plurality of first non-contacting electrodes, the second via portion being coupled to the plurality of second non-contacting electrodes.

5. The method according to claim 1, wherein the vias extend at a right angle to the electrodes.

6. The method according to claim 5, further including an insulator disposed over the electrodes.

7. The method according to claim 1, wherein the measurements of the predetermined matter accumulation profiles are associated with the accumulation of ice in-flight, and the sensor monitor generating an assessment comprises the sensor monitor generating the assessment in substantially real-time of an accumulation of ice on the aircraft surface in-flight.

8. The method according to claim 1, wherein the measurements of the predetermined matter accumulation profiles are associated with the accumulation of super-cooled large water droplets in-flight, and the sensor monitor generating an assessment comprises the sensor monitor generating an assessment in substantially real-time of an accumulation of super-cooled large water droplets on the aircraft surface in-flight.

9. A matter accumulation monitoring system, comprising:
an electric field sensor unit configured to apply varying electric fields to an aircraft surface and to measure a temperature of the aircraft surface; and
a sensor monitor in communication with the electric field sensor unit, the sensor monitor being configured to receive a time-series of measurements of the temperature of the aircraft surface and a phase and a magnitude of a current induced in an electric field sensor of the electric field sensor unit from the varying electric fields, the time-series of the measurements varying in accordance with an instantaneous accumulation of matter on the aircraft surface, the sensor monitor being further configured to generate an assessment of an accumulation of the matter on the aircraft surface from a correlation of the time-series of the measurements with at least one predetermined matter accumulation profile, each said predetermined matter accumulation profile comprising a corresponding time-series of current phase, current magnitude and temperature measurements,
wherein the electric field sensor comprises:
an insulating substrate;
a plurality of electrodes disposed on the substrate and extending parallel to each other on the substrate, the electrodes comprising a plurality of first electrodes and a plurality of second electrodes interleaved and non-contacting with the plurality of first electrodes; and
a plurality of vias coupled to the electrodes and extending transversely through the substrate.

10. The monitoring system according to claim 9, wherein the sensor monitor is configured to activate an alarm in accordance with a result of the correlation.

11. The monitoring system according to claim 9, wherein the electric field sensor unit comprises a sensor processing unit coupled to the electric field sensor, and the sensor processing unit is configured to generate the at least one measurement set by periodically monitoring an amplitude of a current signal induced in the electric field sensor.

12. The monitoring system according to claim 9, wherein the vias comprise a first via portion and a second via portion, the first via portion being coupled to the plurality of first non-contacting electrodes, the second via portion being coupled to the plurality of second non-contacting electrodes.

13. The monitoring system according to claim 9, wherein the vias extend at a right angle to the electrodes.

14. The monitoring system according to claim 13, wherein the electric field sensor includes an insulator disposed over the electrodes.

15. The monitoring system according to claim 9, wherein the measurements of the predetermined matter accumulation profiles are associated with the accumulation of ice in-flight, and the sensor monitor is configured to generate an assessment in substantially real-time of an accumulation of ice on the aircraft surface in-flight.

16. The monitoring system according to claim 9, the measurements of the predetermined matter accumulation profiles are associated with accumulation of super-cooled large water droplets in-flight, and the sensor monitor is configured to generate an assessment in substantially real-time of an accumulation of super-cooled large water droplets on the aircraft surface in-flight.

* * * * *